(12) United States Patent
Xiang et al.

(10) Patent No.: US 6,287,918 B1
(45) Date of Patent: Sep. 11, 2001

(54) PROCESS FOR FABRICATING A METAL SEMICONDUCTOR DEVICE COMPONENT BY LATERAL OXIDIZATION

(75) Inventors: Qi Xiang, Santa Clara; Scott Allan Bell; Chih-Yuh Yang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/290,086

(22) Filed: Apr. 12, 1999

(51) Int. Cl.[7] ................................................. H01L 21/336
(52) U.S. Cl. ........................ 438/265; 438/595; 438/596
(58) Field of Search ................................................. 438/596

(56) References Cited

U.S. PATENT DOCUMENTS 5,866,473 * 2/1999 Xiang et al. ........................ 438/585
5,929,527 * 7/1999 Yamazaki et al. .................... 257/771
6,004,850 * 12/1999 Lucas et al. ......................... 438/301

* cited by examiner

*Primary Examiner*—Charles Bowers
*Assistant Examiner*—William M. Brewster
(74) *Attorney, Agent, or Firm*—Brinks, Hofer, Gilson & Lione

(57) ABSTRACT

A process for fabricating a semiconductor device includes the formation of a metal device feature layer using lithographic techniques, followed by an oxidation process to reduce the lateral dimension of the metal device feature. The oxidation process is carried out by selectively, laterally oxidizing the metal composition of the device feature that overlies a dielectric layer. The lateral oxidation process forms metal oxide sidewall spacers on the device feature. Upon completion of the oxidation process, the metal oxide sidewall spacers are removed and a residual layer of unoxidized metal remains. The lateral dimension of the residual layer can be substantially less than that achievable by optical lithographic techniques.

19 Claims, 2 Drawing Sheets

PROCESS FOR FABRICATING A METAL SEMICONDUCTOR DEVICE COMPONENT BY LATERAL OXIDIZATION

REFERENCE TO RELATED APPLICATIONS

Related subject matter is disclosed in the following commonly-assigned, co-pending patent applications filed on even date herewith:

| TITLE | SERIAL NO./ FILING DATE |
|---|---|
| PROCESS FOR FABRICATING A SEMICONDUCTOR DEVICE COMPONENT USING LATERAL METAL OXIDATION | 09/290,555 |
| PROCESS FOR FABRICATING A SEMICONDUCTOR DEVICE COMPONENT BY OXIDIZING A SILICON HARD MASK | 09/290,088 |
| PROCESS FOR FABRICATING A SEMICONDUCTOR DEVICE COMPONENT USING A SELECTIVE SILICIDTION REACTION | 09/290,087 |

FIELD OF THE INVENTION

This invention relates, in general, to semiconductor device fabrication, and more particularly, to the fabrication of MOS transistors having sub-micron dimensions.

BACKGROUND OF THE INVENTION

There is a continuing trend in the semiconductor industry to fabricate integrated circuits of increasing complexity. As the complexity of an integrated circuit increases, the cost associated with fabricating the integrated circuit also increase. In order to provide integrated circuit devices having increased functional capability, while maintaining control over the cost associated with fabrication, more devices must be included on each semiconductor wafer. In recent years, integrated circuit fabrication technology has achieved the ability to define circuit components having feature sizes in the sub-microns size range. For example, new lithographic techniques have been developed using x-ray and deep UV energy sources. Additionally, film deposition technology now exist that can form thin-films having a precisely determined metallurgical composition and thickness. Furthermore, thin-film etching techniques have been developed which are capable of selectively etching one metallurgical composition, while not substantially etching other metallurgical compositions present on the semiconductor substrate.

However, even with the marked advances in fabrication technology, achievement of the necessary packing density and cost control in the manufacture of modern integrated circuits requires further processing innovations. This is because as device dimensions, such as the length of gate electrodes in metal-oxide-semiconductor (MOS) transistors, continue to be scaled to smaller dimensions new physical process limitations arise.

One major impediment to further size reduction of MOS transistors relates to the physical limitation of lithographic technology. Photolithographic techniques utilize an optically sensitive resist material that is formed on a semiconductor substrate. A photolithographic mask having a predetermined pattern is aligned to the semiconductor wafer and light is passed through the mask. After exposing the resist, the resist is developed to form a pattern on the wafer. The photoresist exposure steps typically require a difficult alignment of the mask with the wafer. In addition to alignment difficulty, the smallest feature size that can be photolithographically defined is limited by optical defraction. To reduce the amount of defraction in lithographic operations, manufacturers have resorted to the use of deep UV lithographic techniques to overcome some of the diffraction problems encountered using higher wave lengths of light.

However, even deep UV lithography is not able to reliably define feature sizes of 0.1 microns and smaller.

To further enhance the performance of lithographic technology, manufacturers have developed advanced resist materials and coatings, such as antireflective coatings, and the like, to improve the ability of optical lithography to produce sub-micron features. Additionally, post-feature definition methods, such as photoresist trimming, are also used to reduce the feature size to dimensions below the photolithographic limit. Although advances in resist materials and processing methods have extended the limit of lithography to smaller dimensions, the precise formation of extremely small feature sizes remains beyond the ability of present process technology.

The fabrication of MOS transistors to have gate electrodes on the order of 0.1 microns requires processing technology beyond existing lithographic and resist formulation technologies. In many ways, the smallest feature size to which an MOS gate electrode can be fabricated governs the scaling of all other device components in an integrated circuit. The feature size of an MOS gate electrode must be continuously scaled down to improve the performance and operational capabilities of an integrated circuit. Accordingly, an improved fabrication process is necessary to reliably manufacture device components, such as MOS transistors having gate lengths on the order of 0.1 microns and smaller.

SUMMARY OF THE INVENTION

The present invention is for a process of fabricating a semiconductor device having feature sizes that are independent of lithographic limitations. In one embodiment, the process of the invention is advantageously used to fabricate the metal-gate electrode of an MOS transistor. The lateral dimensions of the MOS gate electrode are initially defined by a lithographic process. However, the final lateral dimensions of the metal-gate electrode are defined by oxidizing edge portions of the metal-gate electrode to form metal oxide sidewall spacers. Once the oxidized portions are removed, the remaining unoxidized portion becomes the metal-gate electrode for an MOS transistor. The process of the invention advantageously enables features on semiconductor devices to be fabricated to extremely small lateral dimensions, regardless of the capability of the lithographic system.

In one form, a semiconductor substrate is provided having a metal device feature thereon. The metal device feature is separated from the semiconductor substrate by a dielectric layer and has a first length. An oxidation resistant layer is formed to overlie metal device feature. Then, the metal device feature is laterally oxidized to a device feature having a second length, wherein the second length is less than the first length.

Figure 1:
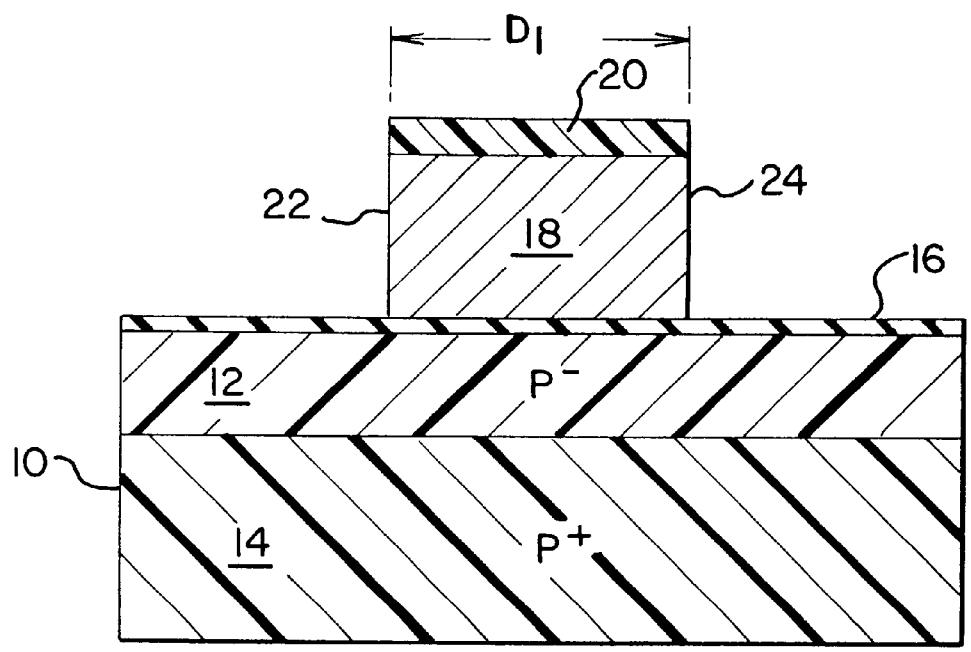
FIGS. 1–5 illustrate processing steps in accordance with the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DSCRIPTION OF PREFERRED EMBODIMENTS

FIGS. 1–5 illustrate processing steps in accordance with the invention for the fabrication of an MOS gate electrode. Although the illustrative embodiment of the invention is described with respect to the fabrication of an MOS gate electrode, those skilled in the art will appreciate that the process of the invention can be used to fabricate a wide variety of device components. For example, the process of the invention can be used to fabricate components, such as electrical leads, thin-film resistors, capacitors, and the like. Accordingly, the present invention contemplates the fabrication of all such device components and is not limited to the fabrication of MOS gate electrodes.

Shown in FIG. 1, in cross-section is a portion of a semiconductor substrate 10 having already undergone several processing steps in accordance with the invention. Semiconductor substrate 10 is fabricated to support a metal-gate MOS device and includes a p− layer 12 overlying a p+ layer 14. A gate dielectric layer 16 overlies an upper surface of semiconductor substrate 10. A metal-gate layer 18 overlies gate dielectric layer 12. In the present embodiment, metal-gate layer 18 is a material capable of forming a semiconductor gate electrode. Preferably, metal-gate layer 18 is a metal, such as aluminum (Al) or an aluminum (Al) alloy, copper (Cu), cobalt (Co), tungsten, titanium (Ti), nickel (Ni) and the like, that is conventionally deposited by physical-vapor-deposition (PVD). P− layer 12 is preferably either single crystal silicon doped to have a p-type conductivity, or p-type epitaxial silicon. Gate dielectric layer 12 is preferably a composite layer of silicon nitride overlying silicon dioxide or silicon oxynitride, or the like. Depending upon the particular type of MOS transistor to be fabricated, gate layer 14 can be doped with a conductivity determining dopant. Additionally, the material of semiconductor substrate 10 can be doped to have an n-type conductivity depending upon the particular conductivity of the metal-gate MOS transistor being fabricated. Typical n-type dopants include phosphorus, arsenic, antimony, and the like, and typical p-type dopants include boron, and the like.

An oxidation resistant layer 20 overlies metal-gate layer 18. Preferably, oxidation resistant layer 20 is an antireflective material, such as silicon oxynitride, and the like. In addition to resisting oxidation, resistant layer 20 also provides an antireflection layer for an optical lithographic process that can be used to define metal-gate layer 18. In one embodiment, metal-gate layer 18 is formed by a conventional lithographic process in which a resist layer (not shown) is deposited to overlie oxidation resistant layer 20, and lithographic processing is carried out to define a metal device feature having a lateral dimension ($D_1$). Preferably a reactive-ion-etch (RIE) process is used to anisotropically etch oxidation resistant layer 20 and metal-gate layer 18. Following the etching process and removal of the resist layer, metal-gate layer 18 is formed to have a first edge 22 and a second edge 24 opposite first edge 22.

Figure 2:
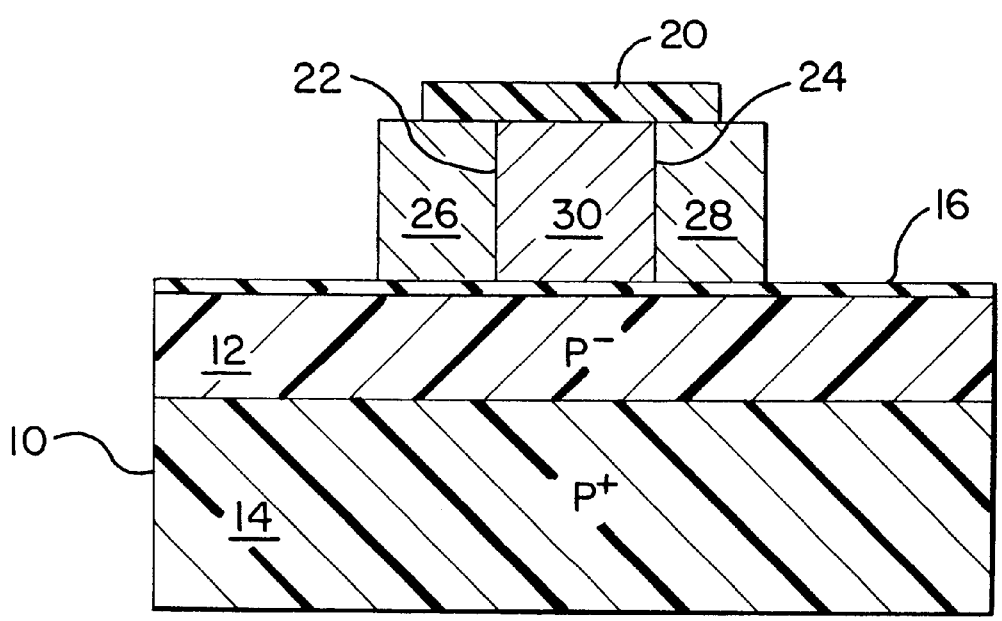

The inventive process continues as illustrated in FIG. 2. After forming metal-gate layer 18, an oxidation process is carried out to oxidize first and second edges 22 and 24. The oxidation process forms metal-oxide sidewall spacers 26 and 28 overlying first and second edges 22 and 24, respectively. The oxidation process causes first and second edges 22 and 24 to recede toward each other as the metal of metal-gate layer 18 is converted to a metal oxide. Upon completion of the oxidation process, a residual layer 30 of unoxidized metal remains overlying dielectric layer 16. Dielectric layer 16 prevents the oxidation of the lower portion of residual layer 30. As described below, the oxidation process advantageously reduces the lateral distance D1 between first and second edges 22 and 24.

In a preferred embodiment of the invention, the oxidation process is carried out in an oxygen ambient at an elevated temperature. The oxidation process can be performed either by thermal oxidation or by rapid-thermal-annealing (RTA). Preferably, the oxidation process is carried out at a temperature of about 700 to 1000° C. The oxidation time will depend upon factors, such as the particular metallurgical composition of metal-gate layer 18, the type of oxidation process used, the temperature, and the like. Importantly, the oxidation time will depend upon the final lateral distance desired between first and second edges 22 and 24 and the initial thickness of metal-gate layer 18.

Figure 3:
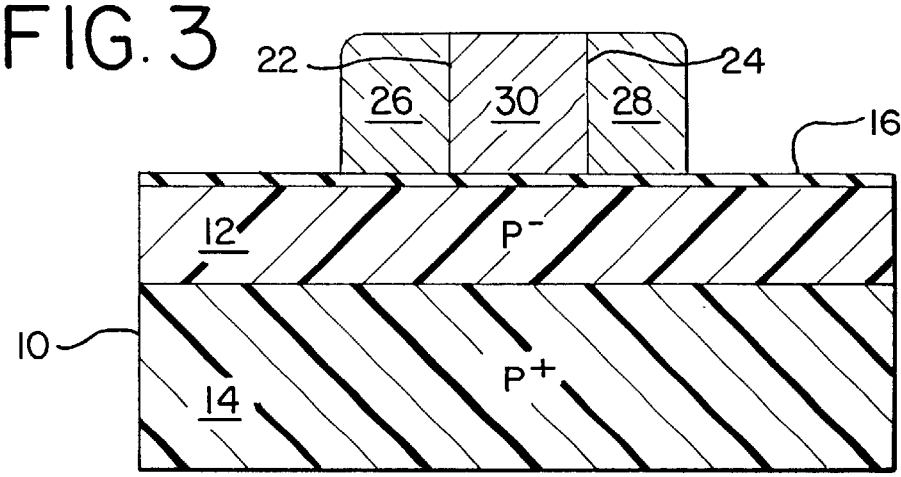

After forming first and second metal-oxide sidewall spacers 26 and 28, oxidation resistant layer 20 is removed, as illustrated in FIG. 3. Oxidation resistant layer 20 is isotropically etched by either a selective wet etching process or by a dry isotropic etching process. The etching process removes oxidation resistant layer 20, while not substantially etching dielectric layer 16, residual layer 30, or first and second metal-oxide sidewall spacers 26 and 28. In a preferred embodiment, where oxidation resistant layer 28 is silicon oxynitride, etching fluorinated hydrocarbon chemistry is used to selective remove oxidation resistant layer 20.

Figure 4:
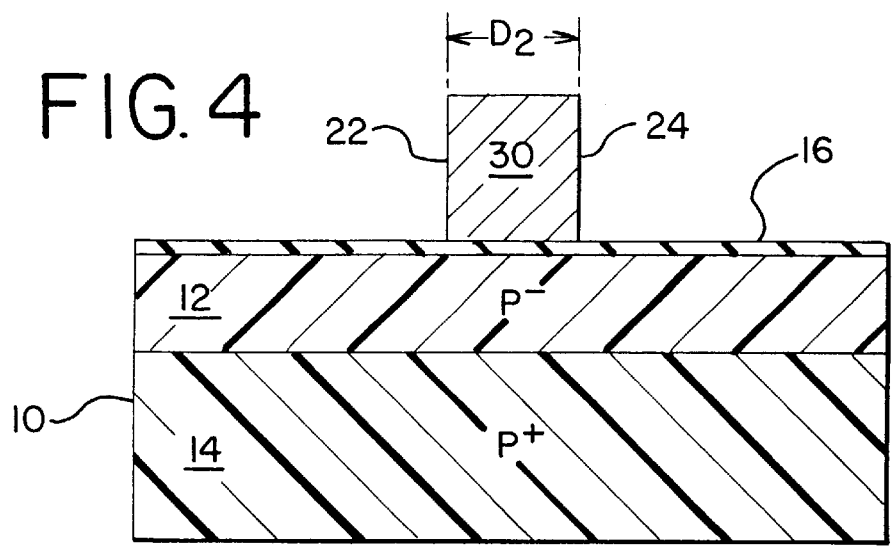

Next, as illustrated in FIG. 4, first and second metal-oxide sidewall spacers 26 and 28 are removed by means by isotropic etching. Preferably, a wet chemical etching process is used to selectively etch first and second metal-oxide sidewall spacers 26 and 28, while not substantially etching dielectric layer 16 or residual layer 30. Preferably, hydrogen fluoride etching chemistry is used to selectively etch away first and second sidewall spacers 26 and 28.

Upon completion of the etching process, residual layer 30 has a lateral dimension ($D_2$). The lateral distance $D_2$ between first and second edges 22 and 24 is substantially less than the lateral dimension $D_1$ originally defined by a lithographic process. The inventive process has advantageously reduced the lateral dimension of metal-gate layer 18 from a lithographically defined lateral dimension $D_1$ to a substantially smaller lateral dimension $D_2$. It is important to note that the reduced lateral dimension $D_2$ has been achieve without the used of a lithographic alignment process. In accordance with the invention, the dimension $D_2$ can be defined to values of about 0.1 microns and smaller. The ultimate dimension achievable by the process of the invention is only limited by the oxidation characteristics and the control of thickness of metal-gate layer 18. Those skilled in the art will appreciate that in many processing technologies the deposition thickness of thin-film materials can be controlled to high precision, while lithographic processes at 0.1 microns can only be controlled with great difficulty. Thus, the inventive process has provided a metal device feature having a dimension $D_2$ that is substantially less than the dimensions achievable by optical lithographic techniques.

Figure 5:
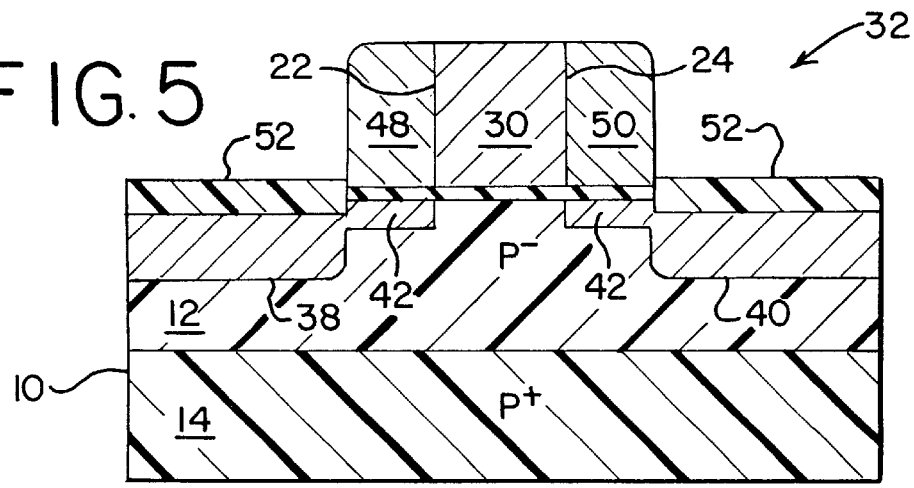

After fabricating residual layer 30 to a lateral dimension of $D_2$, subsequent processing is carried out to complete the fabrication of a metal-gate MOS transistor 32. As illustrated in FIG. 5, source and drain regions 38 and 40 are formed in p– layer 12. Additionally, source/drain extension regions 42 are also formed in p– layer 12 and extend from source and drain regions 38 and 40 to the vicinity of first and second edges 22 and 24 of residual layer 30. Sidewall spacers 48 and 50 are formed overlying first and second edges 22 and 24, respectively. After forming sidewall spacers 48 and 50, silicide contact regions 52 are formed overlying source on drain regions 38 and 40. Those skilled in the art will recognize that metal-gate MOS transistor 32 incorporates many components typically found in sub-micron MOS transistors. Additionally, metal-gate MOS transistor 32 can be either an n-type or a p-type depending on the conductivity of the dopants used to form source and drain regions 38 and 40 and source/drain extension regions 42.

Thus, it is apparent that there has been disclosed a process for fabricating a metal semiconductor device component by lateral oxidation that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various thin-film deposition techniques, such as molecular beam deposition, metal-organic CVD, and the like, can be used. It is therefore intended to include within the invention all such variations and modifications as fall within the scope of the appended claims and equivalents thereof.

What is claimed is:

1. A process for fabricating a semiconductor device comprising the steps of:
   providing a semiconductor substrate having a metal device feature overlying the semiconductor substrate and separated therefrom by a dielectric layer,
   wherein the metal device feature has a first length;
   forming an oxidation resistant layer overlying the metal device feature;
   laterally oxidizing the metal device feature using a process selected from the group consisting of thermal oxidation and rapid thermal annealing to form metal oxide layers and leaving a remaining a metal device feature having a second length,
   wherein the second length is less than the first length.

2. The process of claim 1, further comprising the step of isotropically etching away the first and second oxidized edge portions of the metal device feature.

3. A process for fabricating a semiconductor device comprising the steps of:
   providing a semiconductor substrate having a metal device feature overlying the semiconductor substrate and separated therefrom by a dielectric layer,
   wherein the metal device feature has a first length;
   forming an oxidation resistant layer overlying the metal device feature; and
   laterally oxidizing the metal device feature at a temperature of about 700° C. to 1000° C. using a thermal oxidation process to form a metal device feature having a second length and to form first and second oxidized edge portions of the metal device feature separated by an unoxidized center portion,
   wherein the second length is less than the first length.

4. A process for fabricating a semiconductor device comprising the steps of:
   providing a semiconductor substrate having a metal device feature overlying the semiconductor substrate and separated therefrom by a dielectric layer,
   wherein the metal device feature has a first length;
   forming an oxidation resistant layer overlying the metal device feature; and
   laterally oxidizing the metal device feature at a temperature of about 700° C. to 1000° C. using a rapid thermal annealing process to form a metal device feature having a second length and to form first and second oxidized edge portions of the metal device feature separated by an unoxidized center portion,
   wherein the second length is less than the first length.

5. The process of claim 1, wherein the step of providing a metal device feature comprises providing a metal gate electrode.

6. The process of claim 1, wherein the step of providing a metal device feature comprises providing a metal selected from the group consisting of aluminum (Al), an aluminum (Al) alloy, copper (Cu), cobalt (Co), tungsten, titanium (Ti), and nickel (Ni).

7. The process of claim 1, wherein the step of forming an oxidation resistant layer comprises forming a layer of silicon oxynitride.

8. The process of claim 1, wherein the step of providing a dielectric layer comprises providing a silicon oxide-silicon nitride composite layer.

9. A process for fabricating a semiconductor device comprising the steps of:
   providing a semiconductor substrate having a metal-gate electrode thereon and separated from the semiconductor substrate by a gate dielectric layer;
   forming an oxidation resistant layer overlying the metal-gate electrode;
   laterally oxidizing the metal-gate electrode at a temperature of about 700° C. to 1000° C. using a thermal oxidation process to form metal oxide sidewall spacers thereon,
   wherein the oxidation process leaves a residual layer of unoxidized metal having a second length,
   wherein the second length is less than the first length; and
   removing metal oxide sidewall spacers.

10. The process of claim 9, wherein the step of laterally oxidizing the metal-gate electrode comprises selectively oxidizing the metal-gate electrode to form first and second oxidized edge portions of the oxidizable layer separated by an unoxidized center portion, while not substantially oxidizing the oxidation resistant layer or the gate dielectric layer.

11. The process of claim 9, wherein the step of removing the metal oxide sidewall spacers comprises the step of isotropically etching away the metal oxide sidewall spacers.

12. The process of claim 9, wherein the step of providing a metal-gate electrode comprises providing a layer of metal selected from the group consisting of aluminum (Al), an aluminum (Al) alloy, copper (Cu), cobalt (Co), tungsten, titanium (Ti), and nickel (Ni).

13. The process of claim 12, wherein the step of laterally oxidizing the metal-gate electrode comprises thermal oxidation at a temperature of about 700 to 1000° C.

14. The process of claim 12, wherein the step of laterally oxidizing the metal-gate electrode comprises rapid thermal annealing in an oxidizing ambient at a temperature of about 700 to 1000° C.

15. A process for fabricating a semiconductor device comprising the steps of:

provideing a semiconductor substrate having a metal device component layer thereon and separated from the semiconductor substrate by a dielectric layer, wherein the device component layer has first and second edges spaced apart by a first lateral dimension;

forming an oxidation resistant layer overlying the metal device component layer;

laterally oxidizing the metal device component to form metal oxide sidewall spacers overlying the first and second edges, wherein the first and second edges recede toward each other during the oxidation process and remain separated by an unoxidized residual layer having a second lateral dimension, and wherein the second lateral dimension is less than the first lateral dimension;

removing the oxidation resistant layer;

removing the metal oxide sidewall spacers and leaving the residual layer of unoxidized metal; and forming second sidewall spacers overlying the first and second edges of the residual layer.

16. The process of claim 15, wherein the step of providing a device component layer comprises forming a metal-gate electrode selected from the group consisting of aluminum (Al), an aluminum (Al) alloy, copper (Cu), cobalt (Co), tungsten, titanium (Ti), and nickel (Ni).

17. The process of claim 16 further comprising the step of forming source-drain extension regions in the semiconductor substrate using the second residual layer as a mask prior to the step of forming the second sidewall spacers.

18. The process of claim 17 further comprising the step of forming source and drain regions in the semiconductor substrate using the second sidewall spacers as a mask.

19. The process of claim 15, wherein the step of laterally oxidizing the metal-gate electrode comprises a process selected from the group consisting of thermal oxidation at a temperature of about 700 to 1000° C. and rapid thermal annealing in an oxidizing ambient at a temperature of about 700 to 1000° C.

* * * * *

UNITED STATES PATENT AND TRADEMARK OFFICE
CERTIFICATE OF CORRECTION

PATENT NO. : 6,287,918 B1
DATED : September 11, 2001
INVENTOR(S) : Qi Xiang, Scott Allan Bell and Chih-Yuh Yang It is certified that error appears in the above-identified patent and that said Letters Patent is hereby corrected as shown below:

Title page, Item [54], and Column 1, line 3,
Please replace the word "OXIDIZATION" with -- OXIDATION --.

Column 1,
Line 22, please replace the word "SILICIDTION" with -- SILICIDATION --.

Column 3,
Lines 43 and 52, please replace the number "12" with the number -- 16 --.
Line 55, please replace the number "14" with the number -- 18 --.

Column 4,
Line 46, please replace the number "28" with the number -- 20 --.
Line 48, please replace the word "selective" with -- selectively --.
Line 50, please replace the phrase "by means by" with -- by means of --.
Line 65, please replace the word "achieve" with the word -- achieved --.

Signed and Sealed this

Sixteenth Day of April, 2002

*Attest:*

JAMES E. ROGAN
*Attesting Officer*     *Director of the United States Patent and Trademark Office*